(12) United States Patent
Shinba et al.

(10) Patent No.: US 8,497,481 B2
(45) Date of Patent: Jul. 30, 2013

(54) RADIATION DETECTOR AND METHOD FOR MANUFACTURING SAME

(75) Inventors: Yuichi Shinba, Otawara (JP); Katsuhisa Homma, Otawara (JP)

(73) Assignees: Kabushiki Kaisha Toshiba, Minato-ku, Tokyo (JP); Toshiba Electron Tubes & Devices Co., Ltd., Otawari-Shi, Tochigi (JP)

( * ) Notice: Subject to any disclaimer, the term of this patent is extended or adjusted under 35 U.S.C. 154(b) by 0 days.

(21) Appl. No.: 13/458,068

(22) Filed: Apr. 27, 2012

(65) Prior Publication Data

US 2012/0267539 A1    Oct. 25, 2012

Related U.S. Application Data

(63) Continuation of application No. PCT/JP2010/007264, filed on Dec. 15, 2010.

(30) Foreign Application Priority Data

Dec. 18, 2009    (JP) .................................. 2009-288077

(51) Int. Cl.
*G01T 1/20* (2006.01)

(52) U.S. Cl.
USPC ........................................................ 250/366

(58) Field of Classification Search
USPC ........................................................ 250/368
See application file for complete search history.

(56) References Cited

U.S. PATENT DOCUMENTS

| 4,880,984 | A  | * | 11/1989 | Shiraishi ................... | 250/484.4 |
| 7,741,619 | B2 | * | 6/2010  | Sekiguchi et al. ......... | 250/484.4 |
| 2008/0290285 | A1 | * | 11/2008 | Wakamatsu ............ | 250/370.11 |

FOREIGN PATENT DOCUMENTS

| JP | 2004-186432 |   | 7/2004 |
| JP | 2004186432  | A | 7/2004 |
| JP | 2004-264239 |   | 9/2004 |
| JP | 2004325442  | A | 11/2004 |
| JP | 2006-078471 |   | 3/2006 |
| JP | 2006078471  | A | 3/2006 |
| JP | 2009-031098 |   | 2/2009 |
| JP | 2009-079977 |   | 4/2009 |
| WO | 2009/139215 |   | 11/2009 |

OTHER PUBLICATIONS

Harder, T.A.; Tze-Jung Yao; Qing He; Chi-Yuan Shih; Yu-Chong Tai;, "Residual stress in thin-film parylene-c," Micro Electro Mechanical Systems, 2002. The Fifteenth IEEE International Conference on, vol., no., pp. 435-438, 2002 doi: 10.1109/MEMSYS.2002.984296.*

(Continued)

*Primary Examiner* — David Porta
*Assistant Examiner* — Hugh H Maupin
(74) *Attorney, Agent, or Firm* — Banner & Witcoff, Ltd.

(57) ABSTRACT

According to one embodiment, a radiation detector comprises an array substrate having thereon a photoelectric conversion element for converting fluorescence into an electrical signal and having the outermost layer covered with a protective film, a scintillator layer provided on the protective film and converting incident radiation into fluorescence, and a reflective layer filmed by coating and drying paste-like material containing light-scattering particles and a binder provided on the scintillator layer, wherein the protective film is made of a thermoplastic resin having a softening point not higher than the film formation temperature of the scintillator layer and extending on the array substrate over an area of the reflective layer.

19 Claims, 2 Drawing Sheets

OTHER PUBLICATIONS

Written Opinion and International Search Report in corresponding PCT/JP2010/007264, dated Jul. 19, 2012, stamped received Aug. 3, 2012.

International Search Report for International Application No. PCT/JP2010/007264 dated Feb. 8, 2011.

Korean Office Action issued in corresponding Korean Application, received Apr. 15, 2013.

Japanese Office Action issued in corresponding Japanese Application., received Apr. 15, 2013.

* cited by examiner

US 8,497,481 B2

RADIATION DETECTOR AND METHOD FOR MANUFACTURING SAME

CROSS-REFERENCE TO RELATED APPLICATIONS

This application is a continuation application of PCT application No. PCT/JP2010/007264, filed. Dec. 15, 2010, which is based upon and claims the benefit of priority from Japanese Patent Application No. 2009-288077, filed on Dec. 18, 2009, the entire contents of which are incorporated herein by reference.

FIELD

Embodiments described herein relate generally to a radiation detector that detects radiation and a method for manufacturing same.

BACKGROUND

A planar X-ray detector using an active matrix has been developed as a new generation X-ray diagnostic detector. The planar X-ray detector detects X-ray radiation and outputs a radiograph or a real-time X-ray image as a digital signal.

In general, an X-ray detector has an array substrate serving as a photoelectric conversion substrate that converts the fluorescence into an electric signal, a scintillator layer serving as an X-ray conversion section that is provided on the surface of the array substrate and converts the incident X-ray into the fluorescence, a reflective layer that is provided on the scintillator layer as necessary so as to reflect the fluorescence from the scintillator layer towards the array substrate side, and a moisture-proof structure that is provided on the scintillator layer and the reflective layer for protection from outside air or humidity.

Such a X-ray detector converts X-ray into visible light or fluorescence through the scintillator layer and converts the fluorescence into a signal charge through a photoelectric conversion element such as an amorphous silicon (a-Si) photodiode or charge coupled device (CCD), thereby acquiring an image.

A material of the scintillator layer is, generally, cesium iodide (CsI):sodium (Na), cesium iodide (CsI):thallium (Tl), sodium iodide (NaI), or gadolinium oxide sulfide ($Gd_2O_2S$) which are selected depending on usage or required characteristics.

Resolution characteristics can be improved by forming grooves in a scintillator layer by dicing, or by making a pillar structure by stacking materials through a vapor-deposition method.

A reflective layer is formed above the scintillator layer as necessary for the purpose of enhancing fluorescence utilization efficiency to improve sensitivity characteristics. That is, of the fluorescence emitted from the scintillator layer, the fluorescence travelling toward the opposite side to the photoelectric conversion element side is reflected by the reflective layer to increase the fluorescence reaching the photoelectric conversion element side.

For example, as a method for forming the reflective layer, there are known a method that forms a metallic layer having a high fluorescent reflectance, such as a silver alloy and aluminum, on the scintillator layer and a method for applying and forming a light-scattering reflective layer containing a light-scattering material such as $TiO_2$ and a binder resin. A method in which a reflection plate having a metallic surface made of aluminum or the like is not formed on the scintillator layer, but brought into close contact with the scintillator layer to reflect the fluorescence is also put to practical use.

A moisture-proof structure for protection from an outside atmosphere is formed above the scintillator layer and the reflective layer (or reflection plate) so as to prevent characteristic degradation caused by the humidity. Particularly, high moisture-proof performance is required when the CsI:Tl film or the CsI:Na film, which is a material of highly hygroscopic property, is used as the scintillator layer.

As a conventional moisture-proof structure, there are known a structure in which a moisture-proof layer such as an AL foil or the like is adhered and sealed to a substrate at its circumference to ensure moisture-proof performance and a structure in which a moisture-proof layer such as an AL foil or a thin plate is bonded and sealed to a substrate through a surrounding ring structure.

An array substrate constituting a part of the X-ray detector has a structure in which photodiodes each functioning as a photoelectric conversion element, thin-film transistors (TFT) each functioning as a switching element, and a wiring layer connecting the above elements are patterned on a glass substrate, and a protective film is formed on the array substrate for flattering and insulating purposes.

A transparent insulating film is used as the protective film because of the need to transmitting light from a scintillator layer formed on the photoelectric conversion element, and the transparent insulating film is made of an organic resin film, an inorganic film such as SiO, SiN, and SiON, or a laminated film of an organic resin film and an inorganic film.

In the case where a scintillator layer made of CsI is formed on the protective film by a vapor-deposition method, adhesion between the protective film and scintillator layer is of an important factor. Particularly, in the case where a paste material containing a light-scattering material and a binder resin is applied on the scintillator layer followed by drying to form a reflective layer, if the scintillator layer is peeled off from the array substrate due to shrinkage stress of the reflective layer, light scatters due to an air gap between the scintillator layer and array substrate, which may result in occurrence of a serious defect that the resolution is deteriorated.

Embodiments have been made in view of the above point, and an object thereof is to provide a highly reliable radiation detector in which adhesion between an array substrate having thereon photoelectric conversion elements and a scintillator layer is improved configured to make characteristic degradation due to peeling of the scintillator layer difficult to occur, and a method of manufacturing the radiation detector.

DETAILED DESCRIPTION

In one embodiment, a radiation detector includes an array substrate having thereon a photoelectric conversion element for converting fluorescence into an electrical signal and having the outermost layer covered with a protective film, a scintillator layer provided on the protective film and converting incident radiation into fluorescence, and a reflective layer filmed by coating and drying paste-like material containing light-scattering particles and a binder provided on the scintillator layer and reflecting the fluorescence from the scintillator layer towards the array substrate, wherein the protective film is made of a thermoplastic resin having a softening point not higher than the film formation temperature of the scintillator layer and extending on the array substrate over an area of the reflective layer.

The embodiment of a radiation detector will be described below with reference to FIGS. 1 and 2.

Figure 1:
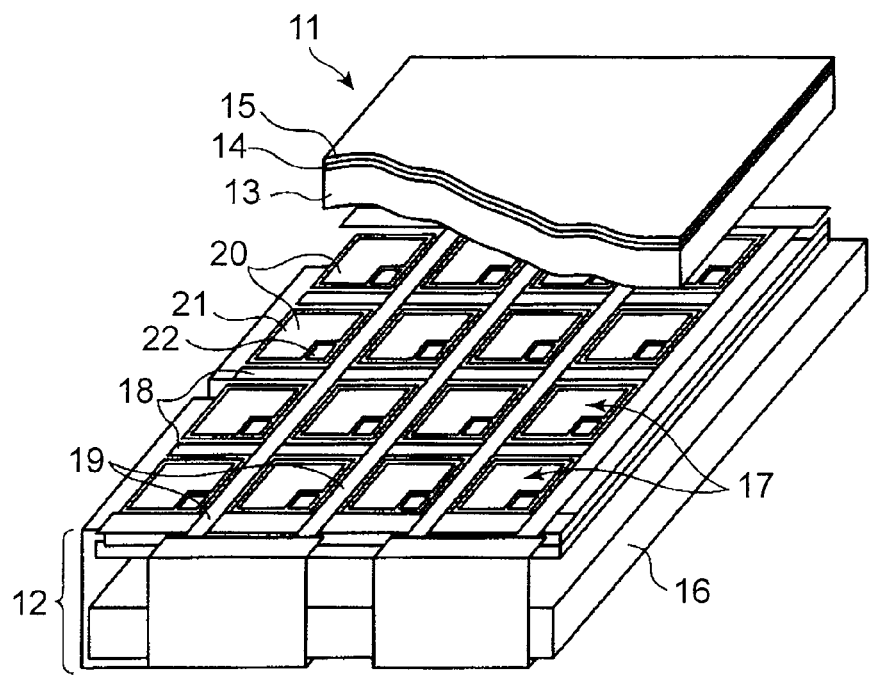
FIG. 1 is a perspective view illustrating a radiation detector according to an embodiment.
Figure 2:
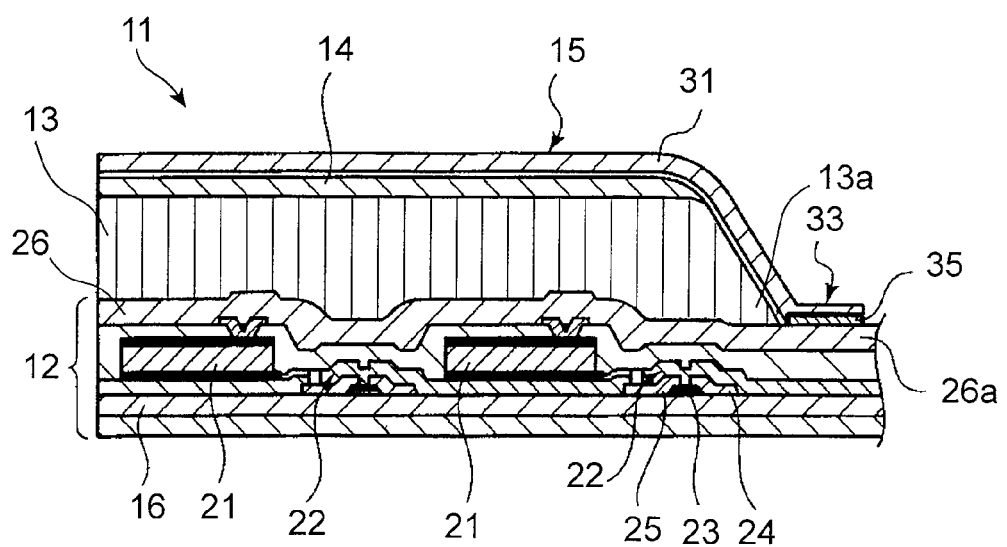
FIG. 2 is a cross-sectional view of the radiation detector of FIG. 1.

FIG. 1 is a perspective view illustrating a radiation detector according to the embodiment, and FIG. 2 is a cross-sectional view of the radiation detector of FIG. 1.

A radiation detector 11 is a planar sensor for detecting an X-ray image (radiograph) and is used for general medical purposes.

As illustrated in FIGS. 1 and 2, the radiation detector 11 has an array substrate 12 serving as a photoelectric conversion substrate that converts fluorescence into an electric signal, a scintillator layer 13 serving as an X-ray conversion section that is provided on one main surface of the array substrate 12 and converts an incident X-ray into fluorescence, a reflective layer 14 that is provided on the scintillator layer 13 so as to reflect the fluorescence from the scintillator layer 13 towards the array substrate 12 side, and a moisture-proof structure 15 that is provided on the scintillator layer 13 and the reflective layer 14 for protection from outside air or humidity. A protective film 26 is mainly composed of an element that does not generate high-boiling oxidation products and is made of a thermoplastic resin having a softening point not higher than the film formation temperature of the scintillator layer 13.

A further description will be given of the above components.

(Array Substrate 12)

The array substrate 12, which is configured to convert the fluorescence or visible light converted from X-ray by the scintillator layer 13 into an electric signal, has an insulating substrate 16 as a glass plate, a plurality of substantially rectangular photoelectric conversion sections 17 provided on the glass substrate 16 and each functioning as a light sensor, a plurality of control lines (or gate lines) 18 arranged in the row direction, a plurality of data lines (or signal lines) 19 arranged in the column direction, a not-illustrated control circuit to which the control lines 18 are electrically connected, and a not-illustrated amplification-conversion section to which the data lines 19 are electrically connected.

Pixels 20 having the same configuration are formed in a matrix on the array substrate 12, and a photodiode 21 functioning as a photoelectric conversion element is provided in each pixel 20. The photodiodes 21 are positioned below the scintillator layer 13.

Each pixel 20 has a thin-film transistor (TFT) 22 functioning as a switching element electrically connected to the photodiode 21 and a not-illustrated storage capacitor functioning as a charge storage section that stores a signal charge obtained through conversion performed by the photodiode 21. However, the capacity of the photodiode 21 can be used as a substitute for the storage capacitor and hence the storage capacitor is not indispensable.

Each thin-film transistor 22 has a switching function of storing and releasing a charge generated upon incidence of the fluorescence on the photodiode 21. At least a part of the thin film transistor 22 is made of a semiconductor material such as amorphous silicon (a-Si) as a noncrystalline semiconductor or polysilicon (P—Si) as a polycrystalline semiconductor.

As illustrated in FIG. 2, the thin-film transistor 22 has a gate electrode 23, a source electrode 24, and a drain electrode 25. The drain electrode 25 is electrically connected to the photoelectric conversion element (photodiode) 21 and storage capacitor.

The storage capacitor is formed into a rectangular planar shape and is disposed corresponding to the bottom portion of each photodiode 21.

The control lines 18 of FIG. 1 are arranged in the row direction so as to extend between the pixels 20 and are electrically connected to the gate electrodes 23 of the thin-film transistors 22 as illustrated in FIG. 2.

The data lines (signal lines) 19 of FIG. 1 are arranged in the column direction so as to extend between the pixels 20 and are electrically connected to the source electrodes 24 of the thin-film transistors 22 as illustrated in FIG. 2.

The control circuit controls the operation state, i.e., on/off of each thin-film transistor 22 and is implemented at the row direction side edge of the surface of the glass substrate 16.

The amplification-conversion section has a plurality of charge amplifiers corresponding to the data lines 19, a parallel-serial converter to which the charge amplifiers are electrically connected, and an analog-digital converter to which the parallel-serial converter is electrically connected.

As illustrated in FIG. 2, the protective layer 26, which is made of a resin, is formed on the photoelectric conversion elements 21 at the outermost part of the array substrate 12 for the purpose of protecting the photoelectric conversion elements (photodiodes) 21 and thin-film transistors 22 and separating from the scintillator layer 13. An outer peripheral region 26a of the protective film 26 spreads over an edge 13a of the scintillator layer 13 so as to extend over the reflective film 14.

(Protective Film 26)

The protective film 26 needs to be transparent in order to allow visible light converted from X-ray by the scintillator layer 13 to reach the photodiodes 21. Further, the protective film 26 is preferably easily processed by photolithography because of the need to form contact holes for wiring to electrode pad portions of the control lines 18 and data lines 19 by means of TAB connection.

Preferably, the protective film 26 is a thermoplastic resin having a softening point not higher than the film formation temperature of the scintillator layer 13 and does not contain Si. That is, in the case where the film formation temperature (substrate temperature) is not higher than 200° C., a thermoplastic resin not containing Si having a softening point less than 200° C., especially, lower than 180° C. is preferably used. Concrete examples of the above thermoplastic resin include an acrylic resin (deformation temperature: about 80° C. to 100° C.), polystyrene (softening point: about 90° C.), polyvinyl chloride (softening point: about 65° C. to 80° C.), and polypropylene (softening point: about 140° C. to 160° C.). Particularly, as is clear from experimental examples described later, in the case where a film structure obtained by forming a alkali halide compound such as cesium iodide (CsI):thallium (Tl) or sodium iodide (NaI):thallium (Tl) in a pillar shape by a vacuum deposition method is used as the scintillator layer 13, it is preferable to use an acrylic organic resin (product name: HRC manufactured by JSR) in terms of adhesion. Further, the protective film 26 preferably has a thickness of a range from 1 μm to 5 μm. When the thickness is less than 1 μm, a pattern difference in level on the lower layer is not sufficiently eliminated and, when the thickness exceeds 5 µm, the amount of light passing through the protective film 26 to reach the underlying photodiodes 21 is reduced.

(Scintillator Layer 13)

The scintillator layer 13 converts the incident X-ray into the visible light or the fluorescence. For example, the scintillator layer 13 is formed into a pillar structure by vacuum deposition method using cesium iodide (CsI):thallium (Tl) or sodium iodide (NaI):thallium (Tl) at a substrate temperature of 150° C. to 200° C. Alternatively, gadolinium oxysulfide ($Gd_2O_2S$) fluorescent particles and a binder material are mixed together, applied onto the array substrate 12, followed by burning and hardening, and a groove portion is formed by dicing with a dicer, thereby forming the scintillator layer 13 into a square pillar shape.

A gap between the pillars is filled with air or an inert gas such as nitrogen ($N_2$) for preventing oxidation, or the gap can be vacuum-encapsulated.

Preferably, as illustrated in the following experimental examples, the scintillator layer 13 is a vapor-deposited film of CsI:Tl. Further, the film thickness is preferably set to about 600 µm, and the diameter of the pillar of the pillar structure crystal of CsI:Tl is preferably set to about 8 µm to 12 µm at the outermost surface.

(Reflective Layer 14)

The reflective layer 14 formed on the scintillator layer 13 reflects the fluorescence travelling toward the opposite side to the photodiodes so as to increase the amount of the fluorescence that reaches the photodiodes.

As the reflective layer 14, a film structure obtained by depositing a metallic layer having a high fluorescent reflectance, such as a silver alloy and aluminum, on the scintillator layer 13, a film structure obtained by bringing a reflection plate having a metallic surface made of aluminum and the like into close contact with the scintillator layer 13, and a film structure obtained by applying and forming the light-scattering reflection layer containing a light-scattering material such as $TiO_2$ and a binder resin may be used.

In the case where a vapor-deposited film of CSI:Tl is used as the scintillator layer 13, resolution may be reduced due to surface coatability of the CsI:Tl vapor-deposited film, loss associated with visible light absorption by a reflective layer material, and spread of reflection light due to increase in the distance between the reflective layer and CsI:Tl vapor-deposited film. In view of this, a paste-like reflective layer material containing light-scattering particles and a binder is suitable for obtaining high brightness/high resolution.

Concretely, for example, it is preferable to use a white paste material (filler: rutile type $TiO_2$, binder: butyral resin, solvent: cyclohexanone) and to substitute a part of the binder resin with plasticizer for stress reduction. The filler particle diameter and binder ratio of the white paste material can be optimized in terms of reflectance and crack resistance.

The white paste material is applied onto the scintillator layer 13 using a dispenser or the like followed by drying to remove the solvent, whereby the reflective layer 14 is formed.

After formation of the reflective layer 14, the moisture-proof structure 15 is formed for the purpose of preventing characteristic degradation due to moisture absorption of the scintillator layer 13. Examples of a moisture-proof method include a method that covers the entire surfaces of the scintillator and reflective layer with a poly-paraxylene thermal CVD film, a method that bonds a hat-like aluminum foil with adhesive agent having high water vapor barrier property for sealing purpose, and a method that uses a moisture-proof layer member having high water vapor barrier property such as a laminated moisture-proof sheet containing an inorganic film (aluminum foil, etc.) and an organic film or a glass plate, and a frame-shaped moisture-proof member arranged close to the periphery of the scintillator.

(Moisture-Proof Structure 15)

The moisture-proof structure 15 protects the scintillator layer 13 and reflective layer 14 from an outside atmosphere to suppress characteristic degradation due to the humidity, etc. and includes a moisture-proof layer 31 having a flange portion 33, and a bonding layer 35.

The AL alloy foil (AlN30-O) having the thickness of 0.1 mmt is pressed into a structure in which the flange portion 33 having a width of 5 mm is provided in the peripheral portion, thereby forming the moisture-proof layer 31 into a hat shape.

Subsequently, adhesive agent is applied onto the flange portion 33 of the hat body using a dispenser to form the bonding layer 35, and the bonding layer 35 is bonded to the array substrate 12 on which the scintillator layer 13 and reflective layer 14 are formed.

As the adhesive agent, a thermosetting adhesive agent or an ultraviolet curable adhesive agent, which are commercially available, may be used.

Not only the AL or AL alloy, but also another metal material may be used to form the moisture-proof layer in the similar fashion; however, the AL or AL alloy foil material is small in X-ray absorption coefficient for a metal material, so that a loss of the X-ray absorption in the moisture-proof layer can advantageously be suppressed and excellent processability is exhibited for processing into the hat-like shape.

Further, by conducting bonding of the moisture-proof structure 15 onto the array substrate 12 by the hat structure under a reduced-pressure atmosphere, there can be provided a moisture-proof structure exhibiting excellent mechanical strength even under a reduced-pressure condition that is assumed to be aircraft transportation.

Forming the moisture-proof structure 15 allows completion of a panel of the X-ray detector 11. Subsequently, wiring is connected to the electrode pad portions of the control lines and signal lines by TAB connection. Each electrode pad portion is connected to a circuit following an amplifier through the wiring. Further, integrating the panel into an enclosure structure results in completion of the X-ray detector 11.

(Peeling Occurring between Array Substrate 12 and Scintillator Layer 13)

In the radiation detector 11 including the array substrate 12, scintillator layer 13, (e.g., CsI:Tl vapor-deposited film), reflective layer 14 (e.g., $TiO_2$ paste), and the like, peeling may be caused at the interface between the scintillator layer 13 and the protective film 26 which is the outermost layer of the array substrate 12 by contraction stress of the reflective layer 14 at the drying time or load applied in a reliability test if the adhesion between the array substrate 12 and the scintillator layer 13 is insufficient.

The peeling between the array substrate 12 and the scintillator layer 13 will be described using FIG. 3.

Figure 3:
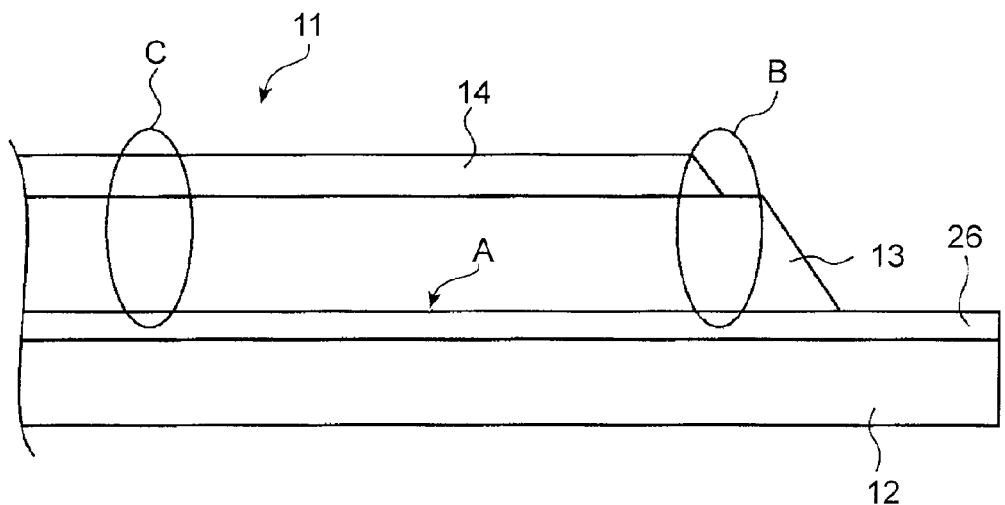
FIG. 3 is a view schematically illustrating peeling occurring between an array substrate and a scintillator layer.

FIG. 3 illustrates an example in which the protective film 26 on the array substrate 12 is made of a silicon-based organic resin material and ultraviolet/ozone cleaning (hereinafter, referred to as "$UV/O_3$ treatment") is performed as surface treatment before vapor-deposition for three minutes.

As illustrated in FIG. 3, in the radiation detector 11 of this example, peeling occurs at a point A along the interface between the scintillator layer 13 and the protective film 26 on the array substrate 12. Further, peeling occurs from the edge surface of the reflective layer 14 at a point B due to stress concentration caused by contraction stress at the drying time of the reflective layer 14. Further, there may be a case where floating of the scintillator layer 13 occurs in a patchy fashion in the area (at a point C which is the center portion of the array substrate 12) other than the edge portion under the influence of soaking of the paste of the reflective layer 14 between the pillars of the scintillator layer 13.

Therefore, it is necessary to evaluate the adhesion between the scintillator layer 13 and the protective film 26 on the array substrate 12; however, in the case where the CsI:Tl vapor-deposited film is used as the scintillator layer 13, it is difficult to quantify the adhesion by a peeling strength/shear strength measurement based on a tape test, a tensile test, or cutting method, centrifugal adhesion measurement, and the like because of fragility of the CsI:Tl vapor-deposited film itself. Thus, adhesion measurements were conducted using the following qualitative method.

EXAMPLES

Experimental Example 1

(Test for Evaluating Adhesion of Scintillator Layer 13)

Figure 4:
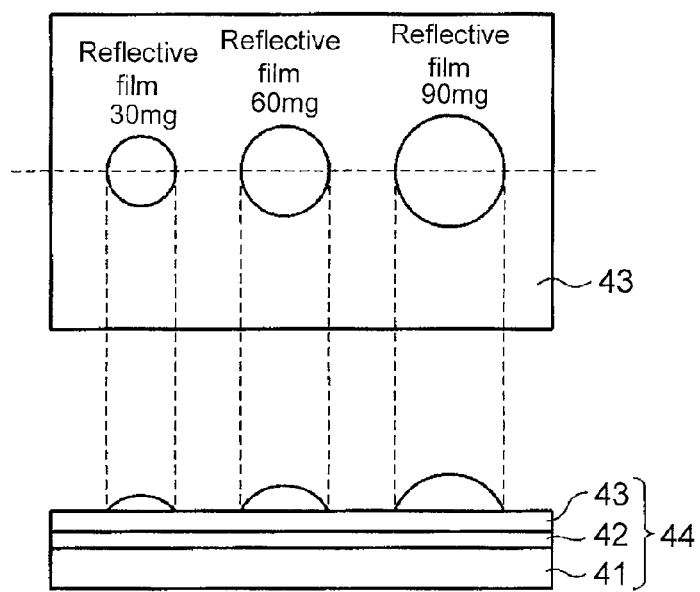
FIG. 4 is a view schematically illustrating an evaluation sample of adhesion between a protective film and scintillator layer in the case where the amount of application amount of a reflective layer is changed.

As illustrated in FIG. 4, in order to evaluate the adhesion of the scintillator layer 13 in a simplified manner, a substrate 44 to be evaluated was prepared in which various protective films 42 were formed on a glass substrate 42 and a CsI:Tl vapor-deposited film 43 having a film thickness of about 600 μm was vacuum vapor-deposited on the protective films 42 at a substrate temperature of 150° C.

The protective films 42 to be evaluated were an acrylic-based organic resin film having a thickness of 2 μm to 3 μm, a silicon-based organic resin film having a thickness of 2 μm to 3 μm, and an inorganic film SiN having a thickness of 30 nm. These protective films were subjected to the $UV/O_3$ treatment as the surface treatment for 0 minute (not subjected to the surface treatment), three minutes, and ten minutes, respectively, followed by CsI:Tl vapor-deposition.

A certain amount of a reflective layer material (filler: rutile type $TiO_2$, binder: butyral resin, solvent: white paste material as cyclohexanone) was dropped to check whether peeling due to contraction stress at the time of drying occurred in the CsI:Tl vapor-deposited film. The obtained result was used as an index of the adhesion.

Three application amounts of the reflective film were used such that the weights of the reflective films after drying were about 30 mg, 60 mg, and 90 mg, respectively, and presence/absence of the peeling of the scintillator layer was determined by observing front and rear surfaces.

The results are summarized in Table 1.

TABLE 1

| Type of protective film 42 | $UV/O_3$ treatment | Peeling presence: x absence: o | | |
|---|---|---|---|---|
| | | 30 mg | 60 mg | 90 mg |
| Acrylic-based organic resin (thermoplastic resin) | 0 minute (no treatment) | x | x | x |
| | 3 minutes | o | o | o |
| | 10 minutes | o | o | o |
| Silicon-based organic resin (thermoset resin) | 0 minute (no treatment) | x | x | x |
| | 3 minutes | x | x | x |
| | 10 minutes | x | x | x |
| SiN (inorganic insulating film) | 0 minute (no treatment) | x | x | x |
| | 3 minutes | x | x | x |
| | 10 minutes | x | x | x |

As is clear from the results of Table 1, peeling or floating of the scintillator layer occurred in the cases of the silicon-based organic resin and SiN due to contraction stress of the reflective layer at the drying time irrespective of whether $UV/O_3$ treatment was applied or not. On the other hand, in the case of the acrylic-based organic resin, application of the $UV/O_3$ treatment prevented occurrence of film peeling due to contraction stress of the reflective layer at the drying time, thereby ensuring sufficient adhesion.

The reasons that sufficient adhesion can be obtained in the case of the acrylic-based organic resin material are as follows:

(1) The resin softening point (T soft) of the acrylic-based organic resin material is not higher than 100° C., which is lower than the substrate temperature (T sub) of 150° C. at the time of vapor-deposition, so that the deposition proceeds in a state where the surface protective film softens while the temperature of the scintillator is rising at the time of vapor-deposition to allow anchor effect to develop.

(2) Applying the $IN/O_3$ treatment provides surface organic contaminant removal effect and surface modification effect.

On the other hand, in the case of the silicon-based organic resin, which is a thermoset resin, the film is hardened at the time of application of the vapor deposition, and although $UV/O_3$ treatment provides surface organic contaminant removal effect, long-time treatment causes decomposition of Si which is a main component of the organic resin to form $SiO_2$ that does not volatilize at the treatment temperature. For these reasons, SiO2 residue remains on the resin surface, which may inhibit adherence between the silicon-based organic resin and the scintillator.

Also in the results of Experimental Example 1, there was a tendency that the adhesion was slightly increased in short-time treatment but it was reduced again in long-time treatment. This adhesion inhibition due to $SiO_2$ residue occurs also in the inorganic film such as SiN.

On the other hand, in the case of the acrylic-based organic resin, there had no problem in the 3-minute and 10-minute $UV/O_3$ cleaning. Thus, the same adhesion test was carried out after the long-time treatment of 17 minutes. The result was that there occurred no peeling of the scintillator layer. As described above, it was confirmed that in the case of the acrylic-based organic resin, there occurred no modification (surface roughness, different phase formation, generation of granular oxides) of the resin surface that inhibits the adhesion even with long $UV/O_3$ treatment time.

Experimental Example 2

(Test for Evaluating Adhesion of Silicon-Based Organic Resin Protective Film that has been Subjected to Surface Treatment)

Next, surface treatment conditions under which the adhesion can be ensured without occurrence of peeling were examined in the case where the silicon-based organic resin was used as the protective film.

Surface treatment was conducted so as not to form oxides such as $SiO_2$ on the surface. Concretely, alcohol (acetone, ethanol) cleaning, He plasma treatment, 180° C.-1 h degassing treatment, primer treatment (silane coupling agent: KBM-1003, KBM-803 manufactured by Shin-Etsu Chemical Co., Ltd.) were carried out.

After that, CsI:Tl vapor-deposited film was vacuum vapor-deposited on the silicon-based organic resin that has been subjected to surface treatment at the substrate temperature of 150° C., and a certain amount of a reflective layer material was dropped to check the presence/absence of peeling.

The results are summarized in Table 2.

TABLE 2

| Type of protective film 42 | Surface treatment | Peeling presence: x absence: o | | |
|---|---|---|---|---|
| | | 30 mg | 60 mg | 90 mg |
| Silicon-based organic resin (thermoset resin) | Acetone cleaning | x | x | x |
| | Ethanol cleaning | x | x | x |
| | Degassing 180° C. × 1 h | x | x | x |
| | Primer treatment KBM-1003 | x | x | x |
| | Primer treatment KBM-803 | x | x | x |
| | He plasma treatment | x | x | x |

As is clear from the results of Table 2, peeling occurred in all tests although the degree of the peeling varied slightly among the tests.

Although the adhesion tended to be improved in He plasma treatment by adjustment of treatment time, output level, He gas pressure, and the like, it was not possible to obtain adhesion high enough to withstand contraction stress of the reflective layer at the drying time. Thus, with the silicon-based organic resin material, it is difficult to ensure adhesion with the CsI:Tl vapor-deposited film.

From the above, in the case where the CsI:Tl is used as the scintillator layer 13, a protective film having the following characteristics needs to be selected in order to ensure sufficient adhesion with the array substrate 12.

(1) A thermoplastic resin having a softening point not higher than the vapor-deposition temperature of the CsI:Tl film in which the film softens during vapor-deposition, e.g., to sticky paste, needs to be selected. That is, a relationship: resin softening point (T soft)<substrate temperature at vapor-deposition time (T sub) needs to be satisfied.

(2) A film whose adhesion is improved by surface modification by the $UV/O_3$ treatment, and not containing a constituent element that generates high-boiling oxidation products through the $UV/O_3$ treatment needs to be selected.

(3) In addition, transparency and excellent photolithographic processability are required for the protective film 26 as the outermost layer of the array substrate 12.

As a film that satisfies the above characteristics (1) to (3), an acrylic-based organic resin (product name: HRC manufactured by JSR) known as a positive ultraviolet photosensitive transparent resist can be cited.

Experimental Example 3

(Test for Evaluating Adhesion of Radiation Detection Panel Using Acrylic-Based Organic Resin Protective Film)

An acrylic-based organic resin (product name: HRC manufactured by JSR) was used as a film that satisfies the above conditions to form the protective film 26 on the outermost layer of the array substrate 12 with a thickness of 2 μm. After application of $UV/O_3$ treatment to the protective film 26 for five minutes, CsI:Tl was vacuum vapor-deposited at the substrate temperature of 150° C. to form the scintillator layer 13 with a thickness of 600 μm. Thereafter, a TiO2 paste was applied followed by drying to form the reflective layer 14 with a thickness of about 110 μm. As a result, peeling of the scintillator layer due to contraction stress of the reflective layer at the drying time did not occur.

Further, an AL alloy foil (AlN30-O) having a thickness of 0.1 mmt was pressed into a structure in which the flange portion 33 having a width of 5 mm is provided in the peripheral portion, thereby forming a hat-like AL hat as the moisture-proof structure 15 for the array substrate 12.

The alcohol cleaning and $UV/O_3$ cleaning were applied to the surface of the AL hat, followed by application of adhesive agent on the resultant surface. Then, $UV/O_3$ cleaning was applied also to the array substrate 12 for bonding between the AL hat and the array substrate 12, thereby obtaining high adhesion.

The $UV/O_3$ treatment for the array substrate 12 needs to be applied only to its peripheral portion to be bonded. In the case where a film in the effective area is modified by the $UV/O_3$ treatment, it is necessary to cover the modified portion with a metal plate that does not transmit UV.

However, the reflective layer 14 is not susceptible to $UV/O_3$ damage, so that it is possible to apply the $UV/O_3$ treatment to the entire surface of the array substrate 12. Also in bonding (refer to FIG. 2) of moisture-proof layer 31/bonding layer 35/array substrate 12 (protective film 26) by the AL hat, the surface cleaning and surface modification can be achieved by the $UV/O_3$ cleaning, and thus the use of an acrylic-based organic resin that does not generate high-boiling oxidation products allowed a high-reliable moisture-proof structure having high bonding strength to be provided.

For evaluating reliability of the radiation detector panel including the moisture-proof structure 15, a cold cycle test ((−20° C./RT/50° C./RT) 60 cycles) and a high temperature/high humidity test (60° C.−90% RH×500 h) were carried out.

As a result, peeling of the scintillator layer 13 due to load applied in the reliability test did not occur, and it was confirmed that sufficient adhesion was ensured between the array substrate 12 and the scintillator layer 13. Further, degradation of brightness/resolution due to moisture absorption of the scintillator layer 13 in the high temperature/high humidity test was not observed, and thus it was confirmed that adhesion of the AL hat was sufficient.

Although the CsI:Tl is used as the scintillator layer 13 in the above experimental tests, it is clear that the same effects can be obtained even in the case where CsI:Na is used in a similar vapor-deposition condition.

According to the embodiments, there can be provided a highly reliable radiation detector in which adhesion between an array substrate having thereon photoelectric conversion elements and a scintillator layer is improved so as to make characteristic degradation due to peeling of the scintillator layer difficult to occur.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A radiation detector comprising an array substrate having a photoelectric conversion element for converting fluorescence into an electrical signal and having a protective film covering the photoelectric conversion element, a scintillator layer provided by direct deposition on the protective film and converting incident radiation into fluorescence, and a reflective layer formed by coating and drying paste-like material containing light-scattering particles and a binder provided on the scintillator layer and reflecting the fluorescence from the scintillator layer towards the array substrate, wherein the protective film is on top of the array substrate, forming a surface in a soft state at the time of the deposition and, made of a thermoplastic resin having a softening point not higher than the film formation temperature of the scintillator layer and extending on the array substrate over an area of the reflective layer.

2. The radiation detector according to claim 1, wherein the scintillator layer is made of an alkali halide compound having a pillar structure, and the softening point of the protective film is lower than 200° C.

3. The radiation detector according to claim 2, wherein the protective film contains as a main component an element that does not generate high-boiling oxide.

4. The radiation detector according to claim 3, wherein the protective film is an acrylic-based organic resin material.

5. The radiation detector according to claim 1, wherein the protective film contains as a main component an element that does not generate high-boiling oxide.

6. The radiation detector according to claim 5, wherein the protective film is an acrylic-based organic resin material.

7. The radiation detector according to claim 1, wherein the surface is flat.

8. A method for manufacturing a radiation detector comprising the steps of:
  forming a protective film made of a thermoplastic resin on the outermost layer of an array substrate having thereon a photoelectric conversion element for converting fluorescence into an electrical signal;
  forming, on the protective film in a soft state, a scintillator layer converting radiation into fluorescence by vacuum deposition at a temperature higher than the softening point of the thermoplastic resin; and
  forming a reflective layer on the scintillator layer by film coating.

9. The method according to claim 8, comprising a step of applying UV/$O_3$ treatment or plasma treatment of gas containing oxygen to the protective film, between the step of forming a protective film and the step of forming a scintillator layer.

10. The method according to claim 9, wherein,
  in the step of forming the scintillator layer by a vacuum deposition method, the substrate temperature at the time of formation of the scintillator layer is set to 200° C. or lower.

11. The method according to claim 8, wherein,
  in the step of forming a scintillator layer by a vacuum deposition method, the substrate temperature at the time of formation of the scintillator layer is set to 200° C. or lower.

12. A radiation detector formation method, comprising:
  forming an array substrate having a photoelectric conversion element for converting fluorescence into an electrical signal and a protective film covering the photoelectric conversion element;
  forming a scintillator layer by direct deposition on the protective film, wherein the scintillator layer is configured to convert incident radiation into fluorescence;
  forming a reflective layer by coating and drying paste-like material containing light-scattering particles and a binder on the scintillator layer,
  wherein the reflective layer is configured to reflect the fluorescence from the scintillator layer towards the array substrate, and
  wherein the protective film is made of a thermoplastic resin having a softening point not higher than the film formation temperature of the scintillator layer and extending on the array substrate over an area of the reflective layer.

13. The radiation detector formation method according to claim 12, wherein the scintillator layer is made of an alkali halide compound having a pillar structure, and the softening point of the protective film is lower than 200° C.

14. The radiation detector formation method according to claim 13, wherein the protective film contains as a main component an element that does not generate high-boiling oxide.

15. The radiation detector formation method according to claim 14, wherein the protective film is an acrylic-based organic resin material.

16. The radiation detector formation method according to claim 12, wherein the protective film contains as a main component an element that does not generate high-boiling oxide.

17. The radiation detector formation method according to claim 16, wherein the protective film is an acrylic-based organic resin material.

18. The radiation detector formation method according to claim 12, wherein the protective film is formed on top of the array substrate, forming a surface in a soft state at the time of the deposition.

19. The radiation detector formation method according to claim 18, wherein the surface is flat.

* * * * *